(12) United States Patent
Matsuhisa

(10) Patent No.: US 8,736,794 B2
(45) Date of Patent: May 27, 2014

(54) LIGHT EMITTING DEVICE

(75) Inventor: Yuko Matsuhisa, Osaka (JP)

(73) Assignee: Panasonic Corporation, Osaka (JP)

( * ) Notice: Subject to any disclaimer, the term of this patent is extended or adjusted under 35 U.S.C. 154(b) by 78 days.

(21) Appl. No.: 13/414,124

(22) Filed: Mar. 7, 2012

(65) Prior Publication Data

US 2012/0236229 A1 Sep. 20, 2012

(30) Foreign Application Priority Data

Mar. 10, 2011 (JP) .................................. 2011-052991

(51) Int. Cl.
*G02F 1/1335* (2006.01)

(52) U.S. Cl.
USPC ............................ 349/115; 349/113; 349/114

(58) Field of Classification Search
CPC ................................. G02F 1/1335; G02F 1/13
USPC .......................................... 349/113, 114, 115
See application file for complete search history.

(56) References Cited

U.S. PATENT DOCUMENTS

| | | | |
|---|---|---|---|
| 6,295,108 B1 * | 9/2001 | Kaneko ........................ | 349/115 |
| 6,639,632 B2 * | 10/2003 | Cheng et al. .................... | 349/12 |
| 7,701,537 B2 | 4/2010 | Takezoe et al. | |
| 8,368,857 B2 * | 2/2013 | Kuo et al. ...................... | 349/115 |
| 2002/0093284 A1 | 7/2002 | Adachi et al. | |
| 2004/0252254 A1 * | 12/2004 | Koo et al. ........................ | 349/58 |
| 2006/0098153 A1 | 5/2006 | Slikkerveer et al. | |
| 2007/0221921 A1 | 9/2007 | Takezoe et al. | |

FOREIGN PATENT DOCUMENTS

| | | |
|---|---|---|
| JP | 2002-215067 | 7/2002 |
| JP | 2004-281080 | 10/2004 |
| JP | 2005-310539 | 11/2005 |
| JP | 2006-72155 | 3/2006 |
| JP | 2006-507528 | 3/2006 |
| JP | 2006-100138 | 4/2006 |
| JP | 2008-59905 | 3/2008 |

* cited by examiner

*Primary Examiner* — Lucy Chien

(74) *Attorney, Agent, or Firm* — Greenblum & Bernstein, P.L.C.

(57) ABSTRACT

Provided is a light-emitting device exhibiting a high light-emission efficiency and moreover may utilize an external light radiating from the back side. A light-emitting device has a light-emitting element and a reflective layer reflecting light emitted from the light-emitting element. The reflective layer has a first layer constituted from a liquid crystal having a helical structure; a second layer disposed on opposite side of the first layer from the light-emitting element, and constituted from a liquid crystal having a helical structure with the same twisting direction as the first layer; and a third layer interposed therebetween to divide a light transmitted through the third layer itself into two intrinsic polarized lights causing a phase difference between the two intrinsic polarized lights.

11 Claims, 2 Drawing Sheets

LIGHT EMITTING DEVICE

BACKGROUND OF THE INVENTION

1. Field of the Invention

The present invention relates to a light-emitting device equipped with a light-emitting element.

2. Description of the Related Art

Small and thin light-emitting elements such as organic electro-luminescence elements are expected to see an expansion of application in fields such as displays and lighting equipments.

Such light-emitting devices equipped with a light-emitting element are often equipped with a reflective film for the purpose of improving light-emission efficiency. For instance, it is described in Japanese Patent Application Laid-open No. 2004-281080 that, in an organic EL element comprising a first electrode, an organic multilayer film and a cathode layered sequentially over a transparent support, the cathode is a mirror-faced reflective film comprising metal.

However, when light is reflected by a reflective film formed from metal, a light illuminating from the back side of the light-emitting device is not transmitted through the reflective film.

Meanwhile, regarding light-emitting devices that are equipped with a light-emitting element, the present inventors have been investigating the application of light-emitting devices to novel uses that utilize the light illuminating from the back side of light-emitting devices. For instance, if a transparent light-emitting device were used as a building material such as of a window glass, the building material would become functional as a lighting device or a display device, while also the external light would be drawn indoors through this building material.

However, in such uses, if a reflective film is used for the purpose of improving the light-emission efficiency, the problem arises, of the light that illuminates from the back side of the light-emitting device being blocked by the reflective film.

SUMMARY OF THE INVENTION

The present invention was devised in view of the above point, and an object thereof is to provide a light-emitting device that has high light-emission efficiency, and moreover, may utilize an external light illuminating from the back side.

The light-emitting device according to the present invention comprises a light-emitting element and a reflective layer that reflects a light emitted from the light-emitting element. The reflective layer includes a first layer constituted from a liquid crystal of a helical structure; a second layer disposed on an opposite of the first layer from the light-emitting element and constituted from a liquid crystal having a helical structure with the same twisting direction as the first layer; and a third layer interposed between the first layer and the second layer. The third layer is configured to divide light transmitted through said third layer itself into two intrinsic polarized lights and cause a phase difference between the two intrinsic polarized lights.

The light-emitting element has a light-emission wavelength region which is overlapped with a selective reflection wavelength region of the first layer and a selective reflection wavelength region of the second layer.

The light-emitting element is preferably an organic electro-luminescent element.

The third layer is preferably constituted from a liquid crystal.

The light-emitting device according to the present invention is preferred to further include has external field control means configured to apply an external field to the third layer for regulating a molecular orientation of the third layer.

The external field control means is preferred to apply the external field to the third layer for switching the molecular orientation of the third layer between a first state where anisotropy exists and a second state where anisotropy is lower than the first state or no anisotropy exists, by subjecting the third layer to the external field.

The third layer is preferably constituted from a liquid crystal and arranged to vary its molecular orientation by application of the external field and keep the molecular orientation after removal of the external field.

Preferably, the light-emitting device according to the present invention further includes orientation control means configured to regular the molecular orientation of at least one of the first layer and the second layer.

In the present invention, at least one of the first layer and the second layer preferably contains a cholesteric blue phase.

Each of the first layer and the second layer is preferred to have the selective reflection wavelength regions ranging from 450 to 700 nm.

It is also desirable that at least one of the first layer and the second layer contains a plurality of liquid crystal layers with different selective reflection wavelength regions.

The light-emitting device may be configured to have a plurality of the reflective layers.

According to the present invention, a light-emitting device is obtained, which light-emission efficiency is high, and moreover, may utilize an external light illuminating from the back side.

DESCRIPTION OF THE PREFERRED EMBODIMENTS

Figure 1:
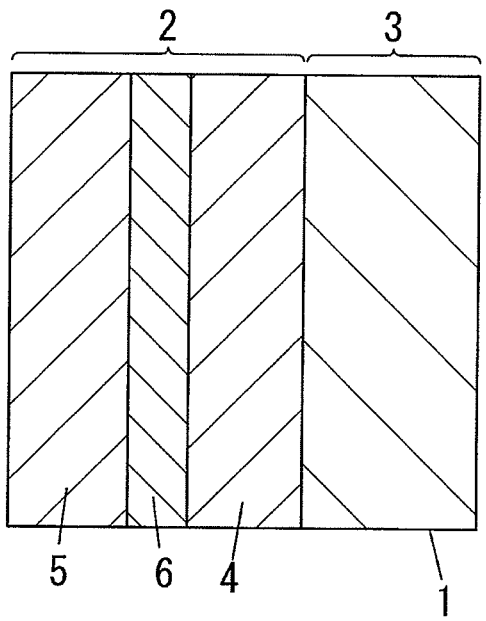
FIG. 1 is a cross-sectional overview showing one mode of a light-emitting device according to an embodiment of the present invention.

A light-emitting device 1 according to the present embodiment comprises a light-emitting element 3 and a reflective layer 2, as shown in FIG. 1.

It is desirable that the light-emitting element 3 is in particular an organic electro-luminescent element (hereafter referred to as organic EL element). Any constitution may be adopted as the element constitution of the organic EL element as long as the effects of the present invention is not countered. For instance, the organic EL element may be a white-color element or a monochromatic element, may be a single unit element or a multi-unit element, may be a fluorescent light-emitting element 3 or a phosphorescent light-emitting element 3, may have a bottom emission structure or may have a top emission structure. Further, the organic EL element is not limited to these.

The organic electro-luminescent element comprises a first electrode, a second electrode and a light-emitting layer, and has a structure in which the light-emitting layer is intercalated between the first electrode and the second electrode.

The first electrode serves the function of injecting positive holes into the light-emitting layer 3, and the second electrode serves the function of injecting electrons into the light-emitting layer 3. The first electrode and the second electrode are preferably formed from electrode materials comprising metals, alloys, electricity-conducting compounds or mixtures thereof. As such electrode materials, electrically conductive light-transmitting materials may be cited, such as, for instance, metals such as gold, CuI, ITO (indium-tin oxide), $SnO_2$, ZnO, IZO (indium-zinc oxide) and the like, electrically conductive polymers such as PEDOT and polyaniline, electrically conductive polymer doped with an arbitrary acceptor or the like, and carbon nanotube. These electrode materials may be formed into films by methods such as, for instance, vacuum deposition method, sputtering method or coating, to form the first electrode and the second electrode. The first electrode and the second electrode may have the electrode structures formed of a conductive layer patterned with metal grids, or the like.

The first electrode and the second electrode have light-transmissibilities that may transmit light from the light-emitting layer. In particular, the transmittance of the first electrode and the second electrode for the light in the wavelength region emitted from the light-emitting layer is preferably 70% or greater. Further, the first electrode and the second electrode preferably may transmit light in a visible light region other than the wavelength region of light emitted from the light-emitting layer.

Further, a sheet resistance for the first electrode and the second electrode, of several hundreds of Wsq (ohms per square) or less is desirable and particularly 100 Wsq (ohms per square) or less is desirable.

In order to adjust characteristics such as light transmittance and sheet resistance in the manners noted above, a thickness for the first electrode and the second electrode, while being different depending on the materials, of 1,000 nm or less is desirable, in the range of 10 to 1,000 nm is more desirable, and in the range of 10 to 200 nm is further desirable. If the first electrode and the second electrode have such thicknesses, the light-emitting device 1 may also have high flexibility.

The light-emitting layer 3 may be formed from an organic light-emitting material suitable to organic EL element uses. As organic light-emitting materials that may form the light-emitting layer 3, compounds that may fluoresce (fluorescent light-emitting material) may be cited, such as, for instance, anthracene, naphthalene, pyrene, tetracene, coronene, perylene, phthaloperylene, naphthaloperylene, diphenyl butadiene, tetraphenyl butadiene, coumarin, oxadiazol, bisbenzoxazoline, bisstyryl, cyclopentadiene, quinoline metal complexes, tris(8-hydroxyquinolinate) aluminum complex (Alq3), tris(4-methyl-8-quinolinate) aluminum complex, tris(5-phenyl-8-quinolinate) aluminum complex, aminoquinoline metal complexes, benzoquinoline metal complexes, tri-(p-terphenyl-4-yl)amine, 1-aryl-2,5-di(2-thienyl)pyrrole derivatives, pyran, quinacridone, rubrene, distyryl benzene derivatives, distyryl arylene derivatives, distyryl amine derivatives and various fluorescent dyes. The light-emitting layer 3 may be formed from a material that phosphoresces (phosphorescent material) by transition between spin multiplets; for instance, the light-emitting layer 3 may be formed from a phosphorescent material that phosphoresces, a compound having a site that phosphoresces in a portion within the molecule, or the like. The light-emitting layer 3 may be formed from two or more species of organic light-emitting materials.

The light-emitting layer may be prepared by a dry process such as vapor deposition and transfer, or may be prepared by a wet process such as spin coat, spray coat, die coat and gravure printing.

Preferably, a positive hole transport layer is intercalated between the first electrode and the light-emitting layer. The positive hole transport layer may be formed from a compound having a suitable hole transport ability. As this species of compounds, for instance, triarylamine series compounds which representative examples are 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazole biphenyl (CBP), Spiro-NPD, spiro-TPD, spiro-TAD, TNB and the like; amine compounds containing a carbazole group; amine compounds containing a fluorene derivative, and the like, may be cited.

Preferably, an electron transport layer is intercalated between the second electrode and the light-emitting layer. The electron transport layer 9 may be formed from a suitable compound having electron-transporting capabilities. As this species of compounds, metal complexes known as electron-transporting materials such as Alq3, and compounds having a heterocycle, such as, phenanthroline derivatives, pyridine derivatives, tetrazine derivatives and oxadiazol derivatives, and the like, may be cited.

The positive hole transport layer and the electron transport layer may be prepared by a dry process such as vapor deposition and transfer, or may be prepared by a wet process such as spin coat, spray coat, die coat and gravure printing.

From the point of view of giving transparency to the organic EL element, as well as from the point of view of giving flexibility to the light-emitting device 1, a range of 50 to 500 nm is desirable for the total thickness of the positive hole transport layer, the light-emitting layer and the electron transport layer.

The reflective layer 2 comprises a first layer 4, a second layer 5 and a third layer 6, and has a structure in which the third layer 6 is intercalated between the first layer 4 and the second layer 5.

The first layer 4 and the second layer 5 are formed from a liquid crystal having a helical structure. The twisting directions of the helical structure in the first layer 4 and the helical structure in the second layer 5 are in the same orientation. Such the first layer 4 and the second layer 5 have selective reflection wavelength regions corresponding to the morphologies of the helical structures, and reflect with high efficiency circularly polarized lights that have the same twisting direction as the helical structure while letting through the other lights, among the lights that have wavelengths within this selective reflection wavelength region.

The light-emission wavelength region of the light-emitting element 3, the selective reflection wavelength region of the first layer 4 and the selective reflection wavelength region of the second layer 5 need to be overlapped at least partially.

The third layer 6 has the function of dividing a light transmitted therethrough into two intrinsic polarized lights and causing a phase difference between the two intrinsic polarized lights.

In the light-emitting device 1, the reflective layer 2 is disposed on the back side of the light-emitting element 3. In the present embodiment, back refers to the face turned toward the side opposite from the exit direction of the light from the light-emitting device 1, while the face turned toward the exit direction of the light from the light-emitting device 1 is referred to as the front. The reflective layer 2 has the first layer 4 disposed so as to face the light-emitting element 3.

In the present embodiment, when the light-emitting element 3 emits light, the light directed from the light-emitting element 3 to the reflective layer 2 first enters the first layer 4. Among the lights that are directed from the light-emitting element 3 to the reflective layer 2, focusing on the lights that have wavelengths included both in the selective reflection wavelength region of the first layer 4 and in the selective reflection wavelength region of the second layer 5 (hereinafter referred to as specific lights), of these specific lights, circularly polarized lights that have the same twisting direction as the helical structure of the first layer 4 are reflected efficiently at the first layer 4.

Among the specific lights, circularly polarized lights that have a twisting direction opposite from the helical structure of the first layer 4 are transmitted through the first layer 4, enter the third layer 6, and their polarization states are altered inside this third layer 6. Circularly polarized light components that have the same twisting direction as the helical structures of the first layer 4 and the second layer 5 are contained in a light which polarization state has been altered. In particular, when the phase difference between the two intrinsic polarized lights becomes 180° in the third layer 6, the light which polarization state has been altered becomes a circularly polarized light that has the same twisting direction as the helical structures of the first layer 4 and the second layer 5. When this light which polarization state has been altered further enters the second layer 5, circularly polarized light components that have the same twisting direction as the helical structure of the second layer 5 are efficiently reflected at the second layer 5.

With the above, among the lights emitted by the light-emitting element 3, the specific lights are reflected with high efficiency at the reflective layer 2. Further, if the light emitted by the light-emitting element 3 contains a component at a wavelength included in only one of the selective reflection wavelength region of the first layer 4 and the selective reflection wavelength region of the second layer 5, a portion of this component is also reflected at the reflective layer 2. Therefore, the light-emission efficiency of the light-emitting device 1 becomes high.

Meanwhile, when a light emitted outside of the light-emitting device 1 (external light) enters the light-emitting device 1 from the back side thereof, of this external light, components at wavelengths that are included in both the selective reflection wavelength region of the first layer 4 and the selective reflection wavelength region of the second layer 5 are reflected by the reflective layer 2, and components at wavelengths that are included in only one of the selective reflection wavelength region of the first layer 4 and the selective reflection wavelength region of the second layer 5 are also partially reflected by the reflective layer 2, while the other components are transmitted through the reflective layer 2 and directed to the front side of the light-emitting device 1. Therefore, utilization of an external light becomes possible with the light-emitting device 1 of the present embodiment.

By suitably adjusting the selective reflection wavelength region of the first layer 4, the selective reflection wavelength region of the second layer 5, as well as the phase difference between the two intrinsic polarized lights at the third layer 6, by reflected light suitable adjustment is implemented for the reflection efficiency of light-emission from the light-emitting element 3, as well as the transmission efficiency of the external light transmitted from the back to front of the light-emitting device 1.

As liquid crystals that may constitute the first layer 4 and the second layer 5, cholesteric liquid crystals (chiral nematic liquid crystals), mixtures of nematic liquid crystal and cholesteric liquid crystal, nematic liquid crystals added with a chiral agent, smectic liquid crystals added with a chiral agent, and the like, may be cited. The liquid crystal may be a macromolecule, a small molecule, or a mixture of macromolecule and small molecule. As long as the helical structure of the liquid crystal is maintained, suitable additives such as pigments may be added to the liquid crystal. It is also desirable that the liquid crystal is cross-linked by an appropriate cross-linking agent or the like to fix the helical structure of the liquid crystal. As methods for cross-linking, glass immobilization, heating, radiation of an energy beam such as ultraviolet light or electron beam, and the like, may be cited.

When at least one among the first layer 4 and the second layer 5 is constituted from a cholesteric liquid crystal, as materials that constitute this cholesteric liquid crystal (liquid crystal substance), macromolecular liquid crystal substances and small molecule liquid crystal substances may be cited. As macromolecular liquid crystal substances, various main chain-type macromolecular liquid crystal substances, side chain-type macromolecular liquid crystal substances, mixtures thereof, and the like, may be cited.

As main chain-type macromolecular liquid crystal substances, macromolecular liquid crystal substances such as of the polyester series, the polyamide series, the polycarbonate series, the polyimide series, the polyurethane series, the polybenzimidazole series, the polybenzoxazole series, the polybenzthiazole series, the polyazomethine series, the polyester amide series, the polyester carbonate series and the polyester imide series, mixtures thereof, and the like, may be cited.

As side chain-type macromolecular liquid crystal substances, macromolecular liquid crystal substances comprising a substance having a backbone chain of a linear or a cyclic structure such as of the polyacrylate series, the polymethacrylate series, the polyvinyl series, the polysiloxane series, the polyether series, the polymalonate series and the polyester series, to which a mesogen group is conjugated as a side chain, mixtures thereof, and the like, may be cited.

As constitutional units of macromolecular liquid crystal substances, aromatic or aliphatic diol units, aromatic or aliphatic dicarboxylic acid units, aromatic or aliphatic hydroxycarboxylic acid units, and the like, may be cited.

As small molecule liquid crystal substances, compounds, demonstrating liquid crystallinity, obtained by introducing a reactive functional group into an extremity, such as saturated benzenecarboxylic acid derivatives, unsaturated benzenecarboxylic acid derivatives, biphenyl carboxylic acid derivatives, aromatic oxycarboxylic acid derivatives, Schiff base derivatives, bisazomethine compound derivatives, azo compound derivatives, azoxy compound derivatives, cyclohexane ester compound derivatives and sterol compound derivatives, compositions with a cross-linking compound added to compounds demonstrating liquid crystallinity among the previous compound derivatives, and the like, may be cited.

As one concrete example of liquid crystal substance, cholesterol derivatives obtained by substituting the OH group of a cholesterol molecule with a variety of radicals may be cited. As cholesterol derivatives, cholesteryl prominate, cholesteryl benzoate, cholesteryl palmitate, and the like, may be cited.

When at least one among the first layer 4 and the second layer 5 is formed by using a nematic liquid crystal, the liquid crystal substance for forming the nematic liquid crystal may be either of a macromolecular liquid crystal substance and a small molecule liquid crystal substance. As macromolecular liquid crystal substances, various main chain-type macromolecular liquid crystal substances, side chain-type macromolecular liquid crystal substances, mixtures thereof, and the like, may be cited.

As main chain-type macromolecular liquid crystal substances, macromolecular liquid crystal substances such as of the polyester series, the polyamide series, the polycarbonate series, the polyimide series, the polyurethane series, the polybenzimidazole series, the polybenzoxazole series, the polybenzthiazole series, the polyazomethine series, the polyester amide series, the polyester carbonate series and the polyester imide series, mixtures thereof, and the like, may be cited.

As side chain-type macromolecular liquid crystal substances, macromolecular liquid crystal substances comprising a substance having a backbone chain of a linear or a cyclic structure such as of the polyacrylate series, the polymethacrylate series, the polyvinyl series, the polysiloxane series, the polyether series, the polymalonate series and the polyester series, to which a mesogen group is conjugated as a side chain, mixtures thereof, and the like, may be cited.

As small molecule liquid crystal substances, compounds, demonstrating liquid crystallinity, obtained by introducing a reactive functional group into an extremity, such as saturated benzenecarboxylic acid derivatives, unsaturated benzenecarboxylic acid derivatives, biphenyl carboxylic acid derivatives, aromatic oxycarboxylic acid derivatives, Schiff base derivatives, bisazomethine compound derivatives, azo compound derivatives, azoxy compound derivatives, cyclohexane ester compound derivatives and sterol compound derivatives, compositions with a cross-linking compound added to compounds demonstrating liquid crystallinity among the previous compound derivatives, and the like, may be cited.

Concrete examples of liquid crystal substances for forming nematic liquid crystals are shown in [Chem. 1] below. Among these liquid crystal substances, a plurality of species may be adopted suitably.

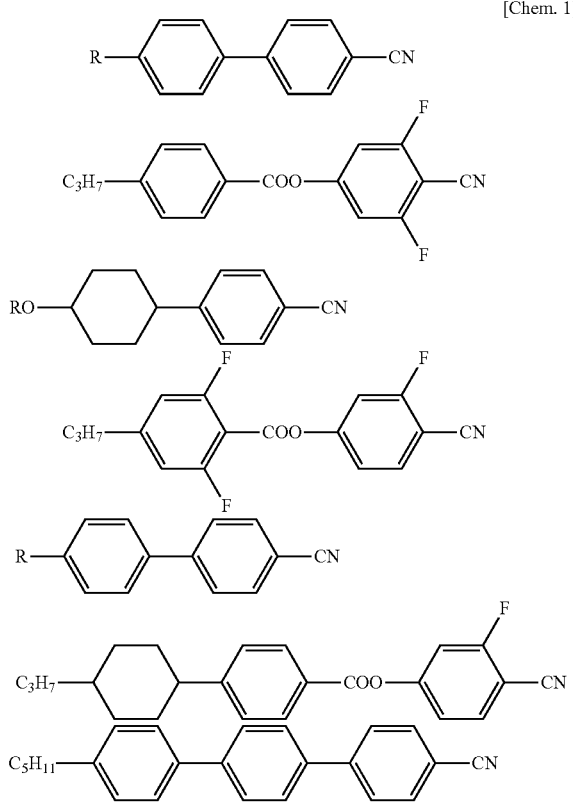

[Chem. 1]

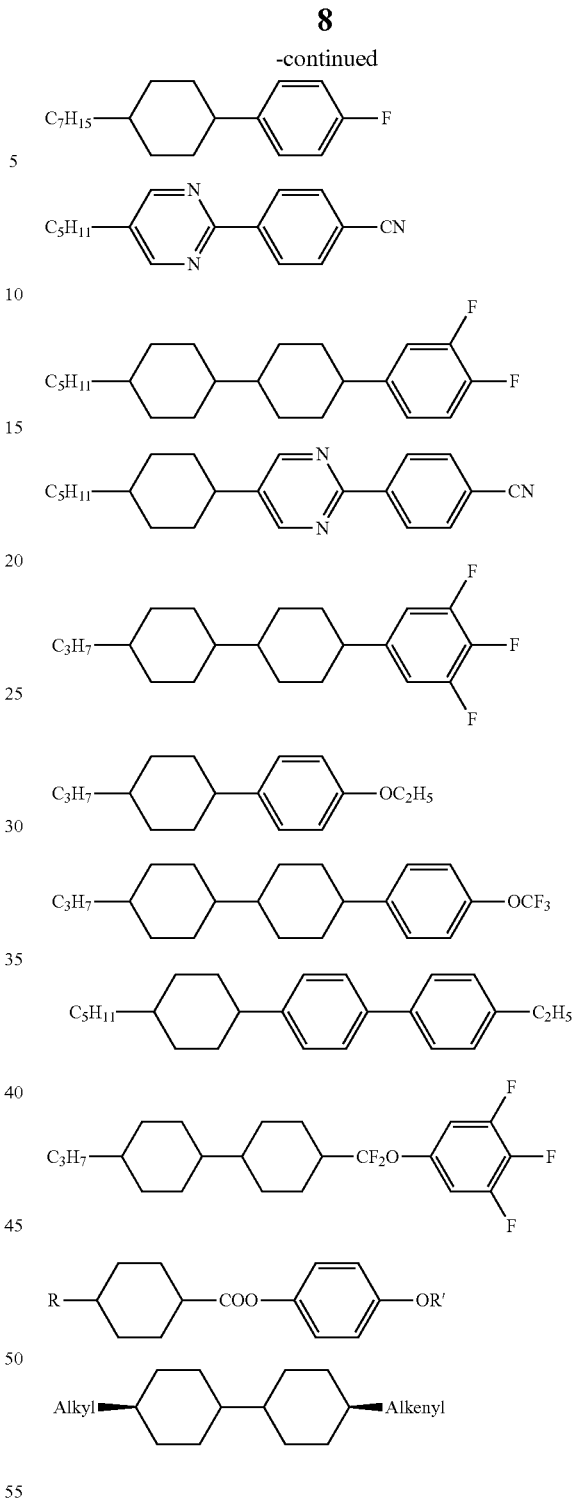

When at least one among the first layer 4 and the second layer 5 is formed by using a smectic liquid crystal, as liquid crystal substances for forming the smectic liquid crystal, 2-(4-hexyloxy-phenyl)-5-octyl-pyrimidine, 5-hexyl-2-(4'-pentyl-biphenyl-4-yl)-pyrimidine, [1,1',4,1"]terphenyl-4,4"-dicarboxylic acid bis-(1-methyl-heptyl)ester, and the like, may be cited, while not being limited to these.

When a chiral agent is added to a nematic liquid crystal or a smectic liquid crystal, a suitable chiral agent may be used. Concrete examples of chiral agent are shown in [Chem. 2] below.

[Chem. 2]

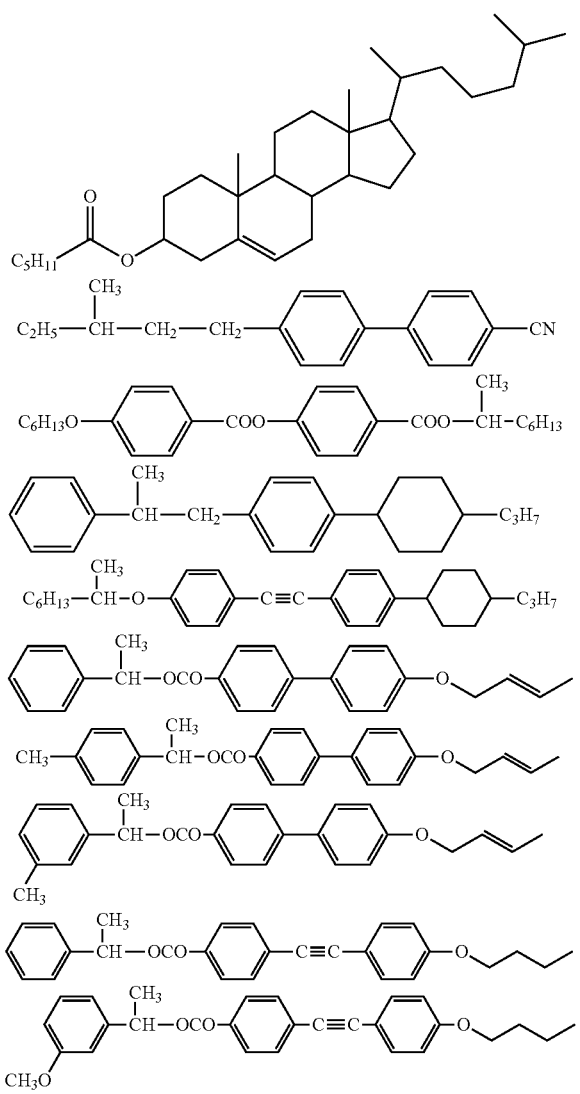

It is also desirable that a cholesteric blue phase is contained in at least one among the liquid crystal that constitutes the first layer 4 and the liquid crystal that constitutes the second layer 5. Since helical axes form a three-dimensionally periodic structure in a cholesteric blue phase, if a cholesteric blue phase is contained in the first layer 4 (the same holds in the case of the second layer 5), lights entering at a variety of incident angles may be reflected by the first layer 4. The cholesteric blue phase may be any structure, such as cholesteric blue phase I and cholesteric blue phase II. Further, when the helical structure of the liquid crystal is not immobilized, the orientation of the cholesteric blue phase changes extremely rapidly according to the change in the external field. Therefore, when the light-emitting device 1 comprises the orientation control means described below, rapidly switching light-reflectivity as well as transmissibility of the first layer 4 becomes possible, by an external field being applied to the first layer 4 containing the cholesteric blue phase (the same holds in the case of the second layer 5), or by an external field applied to the first layer 4 being changed. As external fields in this case, magnetic field, electric field, light, temperature, and the like, may be cited, according to the composition, or the like, of the liquid crystal constituting the first layer 4.

As liquid crystal substances for forming a liquid crystal containing a cholesteric blue phase, a composition is known, obtained for instance by mixing 48.2% by mass of product name JC1041, a mixed liquid crystal manufactured by Chisso Corporation, 47.4% by mass of 4-cyano-4'-pentyl biphenyl, a liquid crystal substance that forms a nematic liquid crystal, and product name ZLI-4572, a chiral agent manufactured by Merck, in a proportion of 4.4% by mass, while not being limited to this.

The liquid crystal in which the cholesteric blue phase is contained may have additives such as macromolecular materials or cross-linking agents added in order to expand the temperature region in which the cholesteric blue phase appears, improve mechanical strength, accelerate the speed of orientation switching due to an external field, and the like.

As methods for forming the first layer 4 or the second layer 5 from a liquid crystal substance, well-known methods may be adopted. For instance, a liquid crystal substance is coated over a suitable substrate and further this is sheeted through heat-treatment, and thereby the first layer 4 or the second layer 5 is formed.

As substrates, films formed from polyimide, polyamide, polyamide imide, polyphenylene sulfide, polyphenylene oxide, polyether ketone, polyether ether ketone, polyether sulfone, polysulfone, polyethylene terephthalate, polyethylene naphthalate, polyallylate, triacetyl cellulose, epoxy resin, phenol resin or the like, uniaxially stretched films from these films, and the like, may be cited.

As necessary, a treatment for causing orientation capability to be exerted is performed beforehand on this substrate. Orientation capability is the ability to induce orientation of the molecules that constitute the liquid crystal. As treatments for exerting orientation capability, treatments whereby a substrate is stretched while being heated under suitable conditions, the so-called rubbing treatment whereby the surface of the substrate is scraped in one direction with a rayon cloth or the like, treatments whereby a molecular orientation layer comprising a well-known orientation agent, such as polyimide, polyvinyl alcohol or silane coupling agent, is overlapped on the surface of the substrate, treatments whereby silicon oxide, or the like, is obliquely vapor-deposited, and the like, may be cited.

When the first layer 4 is formed on a substrate, the first layer 4 may be either incorporated into the reflective layer 2 while still being layered on the substrate, or, be separated from the substrate and incorporated into the reflective layer 2. The same holds in the case of the second layer 5.

The selective wavelength regions of the first layer 4 and the second layer 5 depend on the helical pitches in the helical structures of the liquid crystals that constitute the first layer 4 and the second layer 5. The helical pitch of a liquid crystal may be controlled by well-known methods. For instance, the helical pitch of a liquid crystal may be adjusted by having the liquid crystal substance be adjusted for the temperature, magnetic field, electric field or the like of the atmosphere when the first layer 4 is formed, or be adjusted for the amount of irradiated light while the liquid crystal substance is irradiated with such light as UV light, or be adjusted for the added concentrations of cholesteric liquid crystal substance, chiral agent and the like in the liquid crystal substance.

The breadth of the selective wavelength regions of the first layer 4 and the second layer 5 may be adjusted by suitable methods. For instance, the selective wavelength region of the first layer 4 becomes wide when the first layer 4 is formed from a liquid crystal with a large difference between the extraordinary light refractive index and the ordinary light refractive index (liquid crystal with a high refractive index anisotropy). The same holds in the case of the second layer 5. As methods for elevating the refractive index anisotropy of the liquid crystal, modifying the molecules within the liquid crystal with a biphenyl group or the like, increasing the secondary order parameter of the molecules within the liquid crystal (elevating the orientation of the molecules), and the like, may be cited.

When the first layer 4 is constituted from a liquid crystal having a helical structure which helical pitch is partially modulated, the selective wavelength region of the first layer 4 becomes broad also according to this helical structure. The same holds in the case of the second layer 5. Such a liquid crystal may be formed by well-known methods. For instance, a liquid crystal having a helical structure which helical pitch is partially modulated may be formed by having a liquid crystal substance be formed under an atmosphere subjected to a temperature gradient or an electric field gradient.

When the first layer 4 contains a plurality of layers constituted from liquid crystals (liquid crystal layers), these liquid crystal layers are stacked along the layering direction of the reflective layer 2 and the light-emitting element 3, and, further, selective wavelength regions of these liquid crystal layers are different from one another, the selective wavelength region of the first layer 4 also becomes wide according to the selective reflection wavelength region of each liquid crystal layer. The same holds in the case of the second layer 5. The liquid crystal layers may be formed by similar methods to when the first layer 4 or the second layer 5 comprising a monolayer is formed. The first layer 4 and/or the second layer 5 containing a plurality of liquid crystal layers is produced, for instance, by forming while stacking a plurality of liquid crystal layers sequentially. Once a plurality of liquid crystal layers have been formed separately, the first layer 4 or the second layer 5 may be prepared by having these liquid crystal layers stacked.

At least one among the first layer 4 and the second layer 5 may contain a plurality of liquid crystal layers having the same selective reflection wavelength region. In this case, the reflectance of the reflective layer 2 becomes high according to the layering number of liquid crystal layers.

Within at least one of the first layer 4 and the second layer 5, a plurality of liquid crystal layers with different optical properties may be arranged aligned with an orthogonal direction to the layering direction of the reflective layer 2 and the light-emitting element 3. In this case, the optical properties of the reflective layer 2 may have a distribution in the layering direction of the reflective layer 2 and the light-emitting element 3.

When the first layer 4 contains a plurality of liquid crystal layers, an optical design adjustment layer, molecular orientation layer, coupling layer and the like may be intercalated between the adjoining liquid crystal layers, as necessary. The same holds in the case of the second layer 5. The constitution of a molecular orientation layer is as has been already described. An optical design adjustment layer and a coupling layer are layers that are used for adjusting the optical path length or the phase of the light. Of these, the function of the optical design adjustment layer and the coupling layer is the same, and a layer having the purpose of coupling lights that have different progression directions, in particular, is referred to as the coupling layer. The optical design adjustment layer and the coupling layer may be formed from suitable materials that have light-transmissibility. The optical design adjustment layer and the coupling layer may also be formed from materials only absorbing a light that is in a specific polarization state.

As described above, the central wavelength and the width of the selective wavelength regions of the first layer 4 and the second layer 5 may be adjusted suitably. In particular, if the wavelength region from 450 to 700 nm is included in the selective wavelength regions of the first layer 4 and the second layer 5, that is to say, if the selective wavelength regions of the first layer 4 and the second layer 5 match the wavelength region from 450 to 700 nm or are broader than this, the reflective layer 2 reflects white light with high efficiency. In this case, in particular when a light-emitting element 3 that emits white light is used, the light-emission efficiency of the light-emitting device 1 becomes extremely high.

Since the first layer 4 and the second layer 5 are constituted from liquid crystals, light is reflected by Bragg reflection at the first layer 4 and the second layer 5, and most of the reflected light is reflected at the outer layer portion of the first layer 4 and the second layer 5. Therefore, when light is reflected at the first layer 4 and the second layer 5, light decay is reduced, and therefore, the light-reflectivity of the reflective layer 2 is increased. For a circularly polarized light components within a specific light, which have the same twisting direction as the helical structure, reflectances of the first layer 4 and the second layer 5 of 60% or greater is desirable, and 70% or greater is further desirable, for an improvement of the light-emission efficiency of the light-emitting device 1. In particular, when the wavelength region from 450 to 700 nm is included in the selective wavelength regions of the first layer 4 and the second layer 5, if the reflectance of the first layer 4 and the second layer 5 for circularly polarized light components having the same twisting direction as the helical structure is 60% or greater or further 70% or greater in the wavelength region from 450 to 700 nm, the light-emission efficiency of the light-emitting device 1 can be particularly increased. Note that when the wavelength region of the specific light is narrower than the wavelength region from 450 to 700 nm while the wavelength region from 450 to 700 nm is included in the selective wavelength regions of the first layer 4 and the second layer 5, the light-emission efficiency of the light-emitting device 1 improves sufficiently if the reflectances of the first layer 4 and the second layer 5 is 60% or greater, or further 70% or greater for the polarizations within a specific light, which are in the same twisting direction as the helical structure. In order to improve the reflectances of the first layer 4 and the second layer 5 for a light in a certain wavelength region, for instance, it can adopt methods such as matching the central wavelengths of the selective wavelength regions of the first layer 4 and the second layer 5 with the central wavelength of the specific wavelength region, or adjusting the thicknesses of the first layer 4 and the second layer 5 to increase the twisting number of the helical structure.

When the helical structure of the liquid crystal constituting the first layer 4 is not fixed, it is also desirable that the light-emitting device 1 is equipped with orientation control means for controlling the molecular orientation of the first layer 4. In this case, the orientation of the first layer 4 is controlled by the orientation control means, whereby it is enabled to adjust the light reflection characteristic and transmission characteristic of the first layer 4. The same holds in the case of the second layer 5. As orientation control means, applying an external field such as a magnetic field, an electric field, light or temperature on the first layer 4 or the second layer 5, or means for varying these fields may be cited.

For instance, in a case where the first layer 4 is constituted from a cholesteric liquid crystal and if an electric field or a magnetic field is applied to the first layer 4 by orientation control means, the helical structure of the first layer 4 is distorted, which may decrease the reflectance of the first layer 4. In addition, if the liquid crystal that constitutes the first layer 4 assumes an isotropic state due to application of temperature, an electric field, a magnetic field, or the like, to the first layer 4 by the orientation control means, the reflectance of the first layer 4 may decrease widely, for instance, to 10% or lower. The same holds in the case of the second layer 5.

In a case where the external field is an electric field, orientation control means may be constituted with transparent electrodes layered on both sides in the thickness direction of the first layer 4 or the second layer 5, and a power source that applies an electric field between the two transparent electrodes or varies this electric field. In this case, the molecules that constitute the liquid crystal may have a positive dielectric anisotropy or may have a negative dielectric anisotropy with respect to the external field. Orientation control means provided for instance with a magnetic pole may be used when the external field is a magnetic field, orientation control means provided for instance with a light source may be used when the external field is light, and orientation control means provided for instance with a suitable temperature control device may be used when the external field is temperature, respectively.

While there is no limitation on the thicknesses of the first layer 4 and the second layer 5, a range of 1 to 500 µm is desirable from the point of view of thinning the light-emitting device 1.

Meanwhile, the third layer 6 may be formed from a suitable material having refractive index anisotropy. As such materials, organic materials such as uniaxially stretched films and biaxially stretched films formed from polycarbonate, polysulfone, polyvinyl alcohol, or the like, and inorganic materials such as uniaxial crystals and biaxial crystals such as quartz and calcite may be cited.

It is also desirable that the third layer 6 is constituted from a liquid crystal. In this case, since the third layer 6 can be prepared by utilizing the self-organizing orientation properties of the liquid crystal. Therefore, the third layer 6 is readily prepared, and it is also facilitated to enlarge the surface area of the third layer 6.

As liquid crystals that may constitute the third layer 6, nematic liquid crystals, cholesteric liquid crystals, smectic liquid crystals, and the like, may be cited, and a plurality of types of liquid crystal may be present mixed inside the third layer 6. As liquid crystal substances for forming these liquid crystals, liquid crystal materials similar to those described for the first layer 4 and the second layer 5 may be used.

When the third layer 6 is constituted from a liquid crystal, the third layer 6 may further contain another material aside from the liquid crystal. For instance, the third layer 6 may contain a suitable filler, spacer, pigment or the like, for the purpose of thickness adjustment, optical design or the like.

While the thickness of the third layer 6 is adjusted suitably according to the optical design of the third layer 6, it is desirable that this thickness is 500 µm or less from the point of view of thinning the reflective layer 2.

The liquid crystal that constitutes the third layer 6 may be cross-linked by an appropriate cross-linking agent, or the like, so that the orientation of this liquid crystal is fixed. As methods for cross-linking, glass immobilization, heating, radiation of an energy beam such as ultraviolet light or electron beam, and the like, may be cited. The orientation of the liquid crystal constituting the third layer 6 does not have to be fixed.

When the third layer 6 has a helical structure, it is desirable that the helical structure of the third layer 6 is adjusted so that at least a circularly polarized light component transmitted through the first layer 4 among the specific light is also transmitted through the third layer 6. It is also desirable that the helical structure of the third layer 6 is adjusted so that a circularly polarized light component transmitted through the first layer 4 among the light whose wavelength being in the selective wavelength region of the first layer 4 is also transmitted through the third layer 6.

The phase difference that the third layer 6 generates between the two intrinsic polarized lights is preferably in the range of 160 to 200°. In particular, for the purpose of improving the reflectance of specific light by the reflective layer 2, the phase difference is ideally 180°. In this case, as described above, a light which polarization state has been altered at the third layer 6 in particular becomes a circularly polarized light that has the same twisting direction as the helical structures of the first layer 4 and the second layer 5, therefore this light is reflected efficiently at the second layer 5. However, the preferred value of this phase difference may be varied according to the light-reflectivity and light-transmissibility required of the reflective layer 2, the constitution of layers other than the third layer 6 that the reflective layer 2 is provided with, and the like. The phase difference that this third layer 6 generates between the two intrinsic polarized lights may be adjusted suitably by modifying the species of the materials that constitute the third layer 6, the extent of anisotropy of this material, the thickness of the third layer 6, and the like.

When the third layer 6 is constituted from a liquid crystal and the helical structure of this liquid crystal is not fixed, it is also desirable that the light-emitting device 1 is equipped with external field control means for controlling the molecular orientation of the third layer 6 with an external field. In this case, the orientation of the third layer 6 is controlled by the external field control means, whereby it is possible to adjust the light transmission characteristics of the third layer 6. Therefore, the light-reflectivity as well as the light-transmissibility of the reflective layer 2 can be adjusted by the external field control means.

Figure 2:
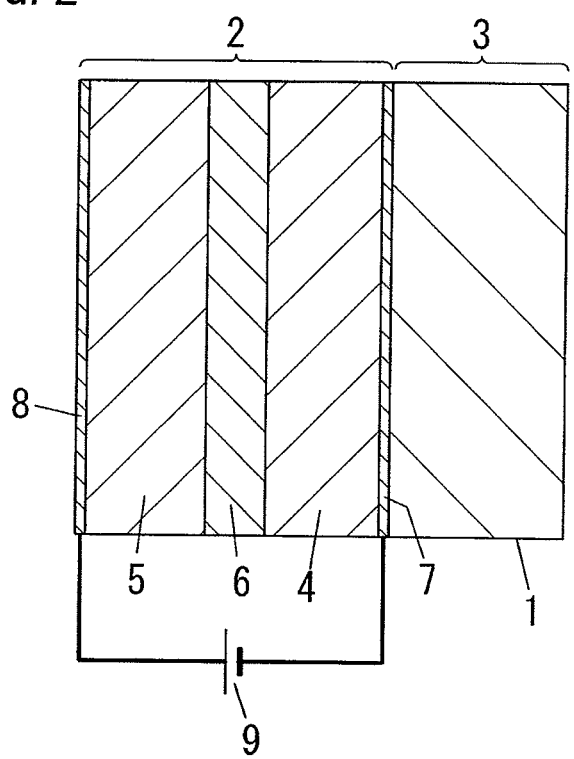
FIG. 2 is a cross-sectional overview showing another mode of a light-emitting device according to an embodiment of the present invention.

As external field control means, applying an external field such as a magnetic field, an electric field, light or temperature and the like on the third layer 6, or means for varying these fields, may be cited. For instance, when the external field is an electric field, as shown in FIG. 2, external field control means may be constituted with transparent electrodes 7 and 8 layered on both sides in the thickness direction of the third layer 6, and a power source 9 that applies a voltage between the two transparent electrodes 7 and 8 or varies this voltage. When the molecular orientations of the first layer 4 and the second layer 5 are fixed and do not vary according to an external field, the two transparent electrodes 7 and 8, which constitute the external field control means, may be layered on the outer surface of the first layer 4 that is on the opposite side from the third layer 6 and on the outer surface of the second layer 5 that is on the opposite side from the third layer 6, respectively, as shown in FIG. 2. The transparent electrode that constitutes the external field control means may also serve as an electrode for the light-emitting element 3 (the first electrode or the second electrode). The molecules that constitute the liquid crystal in the third layer 6 may have a positive dielectric anisotropy or may have a negative dielectric anisotropy, with respect to the external field. For a case where the external field is a magnetic field, it can use an orientation control means provided for instance with a magnetic pole, for a case where the external field is light, it can use an orientation control means provided for instance with a light source, and for a case where the external field is temperature, it can use an orientation control means provided for instance with a suitable temperature control device, respectively.

When the light-emitting device 1 is equipped with external field control means, it is desirable that the molecular orientation in the third layer 6 is switchable by the external field control means to a first state where anisotropy exists and to a second state where anisotropy is lower than the first state or no anisotropy exists. In this case, if the molecular orientation in the third layer 6 is in the first state, the phase difference between the two intrinsic polarized lights transmitted through the third layer 6 is to be large. If the molecular orientation in the third layer 6 is in the second state, either the phase difference between the two intrinsic polarized lights transmitted through the third layer 6 is to be small, or there causes no phase difference. In this way, by having the molecular orientation in the third layer 6 being switched to the first state and the second state, it is possible to adjust the light-reflectivity as well as the light-transmissibility of the reflective layer 2.

For instance, when the phase difference that the third layer 6 in the first state generates between the two intrinsic polarized lights is in the range of 160 to 200°, the light reflectance by the reflective layer 2 is high with the first state. When the molecular orientation in the third layer 6 turns into the second state, the phase difference caused by the third layer 6 between the two intrinsic polarized lights is smaller than the range mentioned previously, or no phase difference is generated. In this case, the light reflectance by the reflective layer 2 is low while the light-transmissibility of the reflective layer 2 is high.

Further, if the molecular orientation in the third layer 6 is adjustable continuously or adjustable in multiple steps between the first state and the second state by the external field control means, it is possible to finely adjust the light-reflectivity as well as the light-transmissibility of the reflective layer 2.

In the first state, the secondary order parameter of the liquid crystal that constitutes the third layer 6 is preferably 0.6 or greater, and in the second state, the secondary order parameter of the liquid crystal that constitutes the third layer 6 is preferably 0.4 or less. This secondary order parameter of liquid crystal may be adjusted suitably by adjusting the external field applied by the external field control means on the third layer 6, according to the species of the liquid crystal that constitutes the third layer 6.

When the molecular orientation in the third layer 6 is in the second state, the molecules inside the liquid crystal that constitutes the third layer 6 may be oriented microscopically; in addition, when the molecular orientation in the third layer 6 is in the first state, the molecules inside the liquid crystal that constitutes the third layer 6 may be randomly oriented macroscopically.

When the light-emitting device 1 is equipped with external field control means, it is also desirable that the third layer 6 is constituted from a liquid crystal in which, when the orientation has been changed by the external field, the molecular orientation after the change is retained even if the external field is removed. That is to say, it is desirable that, for instance, when the molecular orientation has been turned into the first state with an external field being applied to the third layer 6 by the external field control means, the molecular orientation is still maintained in the first state even if the external field is removed; in addition when the molecular orientation has been turned into the second state with an external field being applied to the third layer 6 by the external field control means, the molecular orientation is still maintained in the second state even if the external field is removed. In this case, the energy required to operate the external field control means is saved.

When the external field control means is means for applying an electric field as the external field, in one preferred mode of the third layer 6, the third layer 6 is constituted from a cholesteric liquid crystal. In this case, in the third layer 6, when the molecular orientation has been varied with an electric field applied by the external field control means, the molecular orientation after the variation is retained even if the electric field is removed. That is to say, a cholesteric liquid crystal possesses bistability (memory character), and assumes any of the states among a state that is in a planar orientation, a state that is in a focal conic orientation, and an intermediate state in which the planar orientation and the focal conic orientation are mixed, by way of the electric field intensity applied to the liquid crystal being adjusted. Further, once a state that is in a planar orientation, a state that is in a focal conic orientation, or an intermediate state in which these are mixed is assumed, the state is maintained stably thereafter even under no electric field. Therefore, for instance, when the third layer 6 is applied a direct-current pulse electric field that is suited to the constitution thereof by the external field control means, the molecular orientation in the third layer 6 changes from planar orientation to focal orientation, and the molecular orientation is maintained even if the electric field is removed in this state. In addition, when the third layer 6 is applied a rectangular wave electric field that is suited to the constitution thereof by the external field control means, the molecular orientation in the third layer 6 changes from focal conic orientation to planar orientation, and the molecular orientation is maintained even if the electric field is removed in this state. The first state is defined as the state in which the molecular orientation in the third layer 6 is the planar orientation, or the state in which the predominant molecular orientation in the third layer 6 is the planer orientation. The second state is defined as the state in which the molecular orientation in the third layer 6 is the focal conic orientation, or the state in which the predominant molecular orientation in the third layer 6 is the focal conic orientation. A suitable cross-linking material may be added to the third layer 6 so that maintenance of the molecular orientation under no electric field is facilitated.

The optical properties of each layer from a plurality that constitute the reflective layer 2, may be uniform in the direction orthogonal to the layering direction of the reflective layer 2 and the light-emitting element 3, or may have a distribution in this direction.

Furthermore, for the purpose of adjusting light-reflectivity as well as light-transmissibility, or the like, the reflective layer 2 may further have a layer formed from a liquid crystal having a helical structure with a twisting direction opposite to the first layer 4 and the second layer 5.

With regard to the reflective layer 2, the third layer 6 may be directly stacked on the first layer 4 and/or the second layer 5, or another layer may be intercalated between the third layer 6 and the first layer 4 and/or the second layer 5. The reflective layer 2 and the light-emitting element 3 may also be directly stacked, or another layer may be intercalated between the reflective layer 2 and the light-emitting element 3. As layers that may be intercalated between the third layer 6 and the first layer 4, between the third layer 6 and the second layer 5, as well as between the reflective layer 2 and the light-emitting element 3, molecular orientation layer, optical design adjustment layer, coupling layer, and the like, may be cited. Regarding the constitutions of these layers, they are as already described.

The plurality of layers that constitute the reflective layer 2 may be stacked by suitable methods.

For instance, when the liquid crystals that constitute the first layer 4 and the second layer 5 have no fluidity, and the liquid crystal that constitutes the third layer 6 has fluidity, the first layer 4 and the second layer 5 are formed into sheets, and the liquid crystal that constitutes the third layer 6 is filled between the first layer 4 and the second layer 5 to constitute the reflective layer 2. In this case, a suitable sealing material is intercalated between the peripheries of the first layer 4 and the second layer 5, whereby the third layer 6 is enclosed between the first layer 4 and second layer 5. Further, when the light-emitting device 1 is equipped with external field control means for applying an electric field to the third layer 6, the transparent electrodes of the external field control means are superposed onto the external surface of the first layer 4 and the external surface of the second layer 5, respectively.

Figure 3:
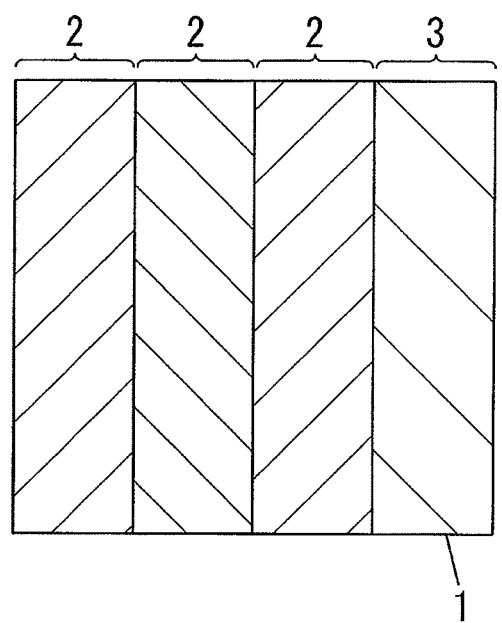
FIG. 3 is a cross-sectional overview showing yet another mode of a light-emitting device according to an embodiment of the present invention.

The light-emitting device 1 may be provided with a plurality of reflective layers 2, as shown in FIG. 3. In this case, the light emitted from the light-emitting element 3 is reflected by a plurality of reflective layers 2, thereby improving the light-emission efficiency of the light-emitting device 1. Further, when the light-emitting device 1 is provided with a plurality of reflective layers 2 with wavelength regions for reflecting light that are different from one another, a broad wavelength region of light emitted by the light-emitting element 3, may be reflected by the plurality of reflective layer 2.

The light-emitting device 1 may be provided with a suitable substrate. The substrate is, for instance, stacked on the front of the light-emitting element 3, or stacked on the back of the reflective layer 2. It is also desirable that substrates are superposed to the front of the light-emitting element 3 and to the back of the reflective layer 2, respectively. The light-emitting element 3 and the reflective layer 2 may be protected by such substrates. The locations where these substrates are disposed may be, in addition to the locations mentioned previously, between the first layer 4 and the third layer 6, between the third layer 6 and the second layer 5, between the reflective layer 2 and the light-emitting element 3, and the like. The substrate may double as the substrate of the light-emitting element 3. When the substrate is superposed to the reflective film, the material constituting the substrate is stacked onto a reflective film by a method such as vacuum deposition method, sputtering method or coating method. In this way the substrate may be formed. While the thickness of the substrate is not limited in particular, in order for the substrate to have a sufficient mechanical strength, 50 nm or greater is desirable.

It is desirable that the substrate has light-transmissibility. As the material quality of the substrate, transparent glass such as soda lime glass and non-alkali glass, and suitable resin materials such as polyester resin, polyolefin resin, polyamide resin, epoxy resin and fluorine resin may be cited. The shape of the substrate may be pate-like or film-like. If the substrate has transparency, it may be colorless transparent, it may be colored, it may be in frosted glass-form, for example, depending on the application, or the like, of the light-emitting device 1.

Depending on the application, it is desirable that the light-emitting device 1 according to the present embodiment has flexibility. In this case, for instance, rolling into a tube-shape or folding the light-emitting device 1 with the intent of space saving at the storage place when storing the light-emitting device 1 and transporting the light-emitting device 1 to the place of use and deploying it for use when using the light-emitting device 1 become possible. In order for the light-emitting device 1 having flexibility to be constituted, it is desirable that the light-emitting element 3 is an organic EL element. Since an organic EL element is mainly formed from an organic material, flexibility can be readily given to an organic EL element, therefore, the light-emitting element 3 may have flexibility. As the third layer 6 is also preferably constituted from a liquid crystal, in this case, flexibility is given to the third layer 6 also readily, therefore, flexibility is given readily to the reflective layer 2. It is also desirable that a suitable cross-linking material is added to the liquid crystal constituting the reflective layer 2, in which case, a reflective layer 2 may be formed, which is flexible and strong against bending stress. The light-emitting element 3 and the reflective layer 2 are preferably formed into thin-types so as to be given flexibility. In particular, it is desirable that the light-emitting element 3 is formed to have a thickness of 50 to 500 nm, and that the reflective layer 2 is formed to have a thickness of 1 to 500 μm. When the light-emitting element 3 has a substrate, it is desirable that a substrate that is of the thin-type and has flexibility is used. Even if the material constituting the substrate is hard, the substrate may have flexibility, if thinned. For instance, when the substrate is formed from glass, although depending on the type of glass, a thickness of the substrate of 200 μm or less is desirable, and moreover, 80 μm or less is desirable. When the substrate is formed from a resin, although depending on the type of resin, a thickness of the substrate of 500 μm or less is desirable, and moreover, 150 μm or less is desirable.

Depending on the application, it is also desirable that the light-emitting device 1 according to the present embodiment has stiffness. In this case, for instance, the light-emitting device 1 can be used as a building material, such as, a window glass. In order for the light-emitting device 1 having stiffness to be constituted, for instance, the light-emitting device 1 is provided with a substrate having stiffness. While it suffices that the substrate has a thickness to an extent that the light-emitting device 1 has enough stiffness, for instance when the substrate is formed from glass, while also depending on the type of glass, a thickness of substrate of 100 μm or greater is desirable, and moreover, 200 μm or greater is desirable. When the substrate is formed from a resin, although depending on the type of resin, a thickness of the substrate of 100 μm or greater is desirable, and moreover, 150 μm or greater is desirable. When the light-emitting device 1 has stiffness, while there are no limitations on the thicknesses of the light-emitting element 3 and the reflective layer 2, from the point of view of thinning the light-emitting device 1 in a range where it has stiffness, these thicknesses are preferably thin, similarly to the case where the light-emitting device 1 has flexibility.

Applications of the light-emitting device 1 according to the present embodiment are not limited in particular, and this light-emitting device 1 may be configured as one of various types of lighting devices and display devices, such as, the lighting devices and display devices that double as building materials as described above, as well as flexible-type lighting devices and display devices that have flexibility.

With the optical properties of a plurality of layers constituting the reflective layer 2 being adjusted in the ranges described above, the light-emitting device 1 according to the present embodiment may have a variety of light transmission characteristics and light reflection characteristics.

For instance, when the light emitted from the light-emitting element 3 is monochromatic light or has a narrow wavelength region with respect to the entirety of the visible light region, moreover, corresponding to this, the selective reflection wavelength regions of the first layer 4 and the second layer 5 are also narrow with respect to the entirety of the visible light region, the light emitted from the light-emitting device 1 is reflected at the reflective layer 2. Therefore, the light-emitting device 1 can have the high light-emission efficiency. An external light entering into the light-emitting device 1 via the back of the light-emitting device 1 is partially reflected by the reflective layer 2, while the remainder is transmitted through the light-emitting device 1 and emerges from the front of the light-emitting device 1. Therefore, it is possible to utilize the external light. When this light-emitting device 1 is equipped further with external field control means, if the molecular orientation in the third layer 6 is switched from the first state to the second state by the external field control means, the reflectance by the reflective layer 2 of the light emitted from the light-emitting element 3 is decreased, while the transmittance in the light-emitting device 1 of the external light is increased. In this manner, it is possible to adjust the characteristics of the light-emitting device 1 appropriately.

When the light-emitting element 3 is configured to emit white light and, corresponding to this, the selective reflection wavelength regions of the first layer 4 and the second layer 5 include the entirety of the visible light region, the light emitted from the light-emitting device 1 is reflected at the reflective layer 2. Therefore, the light-emitting device 1 has the high light-emission efficiency. An external light entering into the light-emitting device 1 via the back of the light-emitting device 1 is reflected in its entirety or in its majority at the reflective layer 2. When this light-emitting device 1 is equipped further with external field control means, if the molecular orientation in the third layer 6 is switched from the first state to the second state by the external field control means, the reflectance by the reflective layer 2 of the light emitted from the light-emitting element 3 is decreased, while the external light is allowed to pass through the light-emitting device 1, and it is possible to utilize the external light. In this manner, it is enabled to adjust the characteristics of the light-emitting device 1 appropriately.

The explanations of the behaviors of the light-emitting device 1 in relation to the light transmission characteristics and light reflection characteristics described above have been simplified for the sake of convenience. In reality, for example, resonance phenomena and phase shifts are induced within the light-emitting device 1. Therefore, the light-emitting device 1 has extremely complex behaviors in relation to optical characteristics. With the optical properties of a plurality of layers constituting the light-emitting device 1 being adjusted suitably, a light-emitting device 1 can be configured to reflect efficiently the light emitted from the light-emitting element 3 with the reflective layer 2 and transmit efficiently external light in the wavelength region of the light emitted from the light-emitting element 3.

Examples

Even more concrete examples of the light-emitting element according to the present embodiment will be exposed hereinafter. It goes without saying that the present invention is not limited to the following examples.

Example 1

A first composition was prepared, containing a nematic liquid crystal substance (manufactured by Merck, product no. E44), a chiral agent (manufactured by Merck, product no. S-811), and a photo-polymerization starting agent (manufactured by BASF; product name: IRGACURE 184). The concentration of the chiral agent in the first composition was 30% by mass, and the concentration of the photo-polymerization starting agent was 2% by mass.

A second composition was prepared, containing a nematic liquid crystal substance (manufactured by Merck, product no. E44), and a photo-polymerization starting agent (manufactured by BASF; product name: IRGACURE 184). The concentration of the photo-polymerization starting agent in the second composition was 2% by mass.

An organic EL element (light-emission wavelength region: 480 to 680 nm) equipped with a second electrode comprising an IZO film of 100 nm in thickness was prepared. A polyimide orientation material (manufactured by JSR Corporation; product no. 254) was applied on the second electrode to form a molecular orientation layer. A rubbing treatment was further performed on this molecular orientation layer.

A glass substrate was placed so as to face the molecular orientation layer, and a 6 μm-thick spacer was intercalated between the glass substrate and the molecular orientation layer. Next, the first composition was filled in a space between this molecular orientation layer and the glass substrate, and then this first composition was further irradiated with ultraviolet light to be cured. In this way, a first layer constituted of a cholesteric liquid crystal was formed. Next, the glass substrate and the spacer were removed from the first layer.

A glass substrate was placed so as to face the first layer, and a 3 μm-thick spacer was intercalated between the glass substrate and the first layer. Next, the second composition was filled in a space between this first layer and the glass substrate, and then this second composition was further irradiated with ultraviolet light to be cured. In this way, a third layer constituted of a nematic liquid crystal was formed. Next, the glass substrate and the spacer were removed from the third layer.

Next, a second layer was formed to be superposed to the third layer in a similar manner as the first layer.

A light-emitting device was produced in the manner described above. The selective reflection wavelength regions of the first layer and the second layer in the reflective layer of this light-emitting device were 570 to 640 nm (that is to say, the wavelength region of the specific light was 570 to 640 nm), the reflectance of specific light by the reflective layer was 87%, and the transmittance of the light-emitting device for white light (wavelength: 450 to 700 nm) was 82% (mean value in the wavelength region other than specific light).

Example 2

A third composition was prepared, containing a chiral smectic liquid crystal comprising a mixture from 49.2% by mass of 2-(4-hexyloxy-phenyl)-5-octyl-pyrimidine, 25.1% by mass of 5-hexyl-2-(4'-pentyl-biphenyl-4-yl)-pyrimidine, and 25.6% by mass of [1,1',4,1"]terphenyl-4,4"-dicarboxylic acid bis-(1-methyl-heptyl)ester, as well as a photo-polymerization starting agent (manufactured by BASF; product name: IRGACURE 184). The concentration of the photo-polymerization starting agent in the third composition was 2% by mass.

Molecular orientation layers were formed by coating and forming into films a polyimide orientation material (manufactured by JSR Corporation; product no. JALS-2021-R2) on two glass plates, respectively. A rubbing treatment was further performed on these molecular orientation layers. These two molecular orientation films were placed so as to be in opposition, and a 50 μm-thick spacer was intercalated between the two parties.

The third composition was filled between the two molecular orientation layers, and this third composition was further irradiated with ultraviolet light to be cured. In this way, a first layer constituted from a chiral smectic liquid crystal was formed. Next, the glass substrate and the spacer were removed from the first layer.

A second layer was also formed by the same methods as the first layer.

While the first layer and the second layer were facing leaving a 20 μm gap, a filler was dispersed and placed into this gap. Further, the gap between the first layer and the second layer was filled with a nematic liquid crystal substance (manufactured by Merck, product no. E44) using capillarity. In this manner, a third layer was formed between the first layer and the second layer to obtain a reflective layer.

The first layer of this reflective layer was adhered onto the second electrode of a light-emitting element having the same constitution as in the case of Example 1.

A light-emitting device was produced in the manner described above. The selective reflection wavelength regions of the first layer and the second layer in the reflective layer of this light-emitting device were 590 to 620 nm (that is to say, the wavelength region of the specific light was 590 to 620 nm), the reflectance of specific light by the reflective layer was 62%, and the transmittance of the light-emitting device for white light was 89%

Example 3

After a third layer was formed between the first layer and the second layer in Example 1, transparent electrodes for external field control means were formed on the external surface of the first layer and on the external surface of the second layer, respectively. Otherwise, a light-emitting device was obtained by the same methods as Example 1.

The selective reflection wavelength regions of the first layer and the second layer in the reflective layer of this light-emitting device were 570 to 640 nm (that is to say, the wavelength region of the specific light was 570 to 640 nm).

When the molecular orientation of the third layer in this light-emitting device was in the first state, the reflectance of specific light by the reflective layer was 88%, and the transmittance of the light-emitting device for white light was 80%. Meanwhile, when the molecular orientation of the third layer in this light-emitting device was switched to the second state by the external field control means, the reflectance of specific light by the reflective layer was 40%, and the transmittance of the light-emitting device for white light was 66%.

Example 4

Molecular orientation layers were formed by coating and forming into films a polyimide orientation material (manufactured by JSR Corporation; product no. 254) on two glass plates, respectively. A rubbing treatment was further performed on these molecular orientation layers. These two molecular orientation films were placed so as to be in opposition, and a 50 μm-thick spacer was intercalated between the two parties.

The first composition was filled between the two molecular orientation layers. While generating a temperature gradient in this first composition using a temperature controller, this first composition was irradiated with ultraviolet light to be cured. In this way, a first layer constituted from a cholesteric liquid crystal was formed. Next, the glass substrate and the spacer were removed from the first layer.

A second layer was also formed by the same methods as the first layer.

While the first layer and the second layer were facing leaving a 20 μm gap, a filler was dispersed and placed into this gap. Further, the gap between the first layer and the second layer was filled with a nematic liquid crystal substance (manufactured by Merck, product no. E44) using capillarity. In this manner, a third layer was formed between the first layer and the second layer to obtain a reflective layer.

The first layer of this reflective layer was adhered onto the second electrode of a light-emitting element having the same constitution as in the case of Example 1.

A light-emitting device was produced in the manner described above. The selective reflection wavelength regions of the first layer and the second layer in the reflective layer of this light-emitting device were 450 to 700 nm (that is to say, the wavelength region of the specific light was 450 to 700 nm), the reflectance of specific light by the reflective layer was 73%, and the transmittance of the light-emitting device for white light was 85%.

Example 5

A fourth composition was prepared, containing a nematic liquid crystal substance (manufactured by Merck, product no. E44), a chiral agent (manufactured by Merck, product no. R-811), and a photo-polymerization starting agent (manufactured by BASF; product name: IRGACURE). The concentration of the chiral agent in the fourth composition was 30% by mass, and the concentration of the photo-polymerization starting agent was 2% by mass.

A first layer, a second layer and a third layer were formed by the same method as in the case of Example 4. Next, a glass substrate was placed so as to oppose the first layer, and a 50 μm-thick spacer was intercalated between the two parties. Next, the fourth composition was filled between this first layer and the glass substrate, and this fourth composition was further irradiated with ultraviolet light to be cured. In this way, a liquid crystal layer was formed, constituted from a cholesteric liquid crystal, and having a helical structure in the opposite orientation to the first layer and the second layer. Next, the glass substrate and the spacer were removed from this liquid crystal layer. A reflective layer was obtained in this manner.

The liquid crystal layer of this reflective layer was adhered onto the second electrode of a light-emitting element having the same constitution as in the case of Example 1.

A light-emitting device was produced in the manner described above. The selective reflection wavelength regions of the first layer and the second layer in the reflective layer of this light-emitting device were 450 to 700 nm, the selective reflection wavelength region of the liquid crystal layer was 450 to 700 nm, the reflectance of specific light by the reflective layer was 73%, and the transmittance of the light-emitting device for white light was 85%.

Example 6

A first reflective layer, a second reflective layer and a third reflective layer were produced, having the same structure as the reflective layer in Example 1. With the second layer of the first reflective layer and the first layer of the second reflective layer in opposition, both parties were adhered through a glass plate. Further, with the second layer of the second reflective layer and the first layer of the third reflective layer in opposition, both parties were adhered through a glass plate. Further, the first layer of the first reflective layer was adhered onto the second electrode of a light-emitting element having the same constitution as in the case of Example 1. A light-emitting device was obtained in this manner.

The reflectance of specific light by the reflective layer of this light-emitting device was 93%, and the transmittance of the light-emitting device for white light was 84%.

What is claimed is:

1. A light-emitting device comprising a light-emitting element and a reflective layer reflecting light emitted from the light-emitting element,
   said reflective layer having:
   a first layer constituted from a liquid crystal having a helical structure;
   a second layer disposed on an opposite side of said first layer from said light emitting element and constituted from a liquid crystal having a helical structure with a same twisting direction as said first layer; and
   a third layer interposed between said first layer and said second layer and configured to divide light transmitted through said third layer into two intrinsic polarized lights and to cause a phase difference between the two intrinsic polarized lights, wherein
   a light-emission wavelength region of said light-emitting element, a selective reflection wavelength region of said first layer and a selective reflection wavelength region of said second layer are at least partially overlapped, and
   said reflective layer is disposed on a side of said light-emitting element opposite a light emission side.

2. The light-emitting device according to claim 1, wherein said light-emitting element is an organic electro-luminescent element.

3. The light-emitting device according to claim 1, wherein said third layer is constituted from a liquid crystal.

4. The light-emitting device according to claim 3, further comprising an external field controller configured to apply an external field to said third layer for regulating a molecular orientation of said third layer.

5. The light-emitting device according to claim 4, wherein the external field controller is configured to switch the molecular orientation of said third layer between a first state where anisotropy exists and a second state where anisotropy is lower than the first state or no anisotropy exists.

6. The light-emitting device according to claim 4, wherein the third layer is constituted from a liquid crystal and arranged to vary its molecular orientation by application of the external field and to retain the molecular orientation after removal of the external field.

7. The light-emitting device according to claim 1, further comprising an orientation controller configured to regulate the molecular orientation of at least one of said first layer and said second layer.

8. The light-emitting device according to claim 1, wherein at least one of said first layer and said second layer contain a cholesteric blue phase.

9. The light-emitting device according to claim 1, wherein each of said first layer and said second layer has the selective reflection wavelength regions ranging from 450 to 700 nm.

10. The light-emitting device according to claim 1, wherein at least one of said first layer and said second layer contains a plurality of liquid crystal layers with different selective reflection wavelength regions.

11. The light-emitting device according to claim 1, comprising a plurality of said reflective layers.

* * * * *